US008685781B2

(12) United States Patent
Semonin et al.

(10) Patent No.: US 8,685,781 B2
(45) Date of Patent: Apr. 1, 2014

(54) SECONDARY TREATMENT OF FILMS OF COLLOIDAL QUANTUM DOTS FOR OPTOELECTRONICS AND DEVICES PRODUCED THEREBY (75) Inventors: Octavi Escala Semonin, Eugene, OR (US); Joseph M. Luther, Boulder, CO (US); Matthew C. Beard, Arvada, CO (US); Hsiang-Yu Chen, Chungli (CN)

(73) Assignee: Alliance for Sustainable Energy, LLC, Golden, CO (US)

( * ) Notice: Subject to any disclaimer, the term of this patent is extended or adjusted under 35 U.S.C. 154(b) by 69 days.

(21) Appl. No.: 13/187,276

(22) Filed: Jul. 20, 2011

(65) Prior Publication Data
US 2013/0019930 A1 Jan. 24, 2013

(51) Int. Cl.
H01L 21/00 (2006.01)

(52) U.S. Cl.
USPC ............. 438/82; 438/99; 438/962; 257/40; 257/E25.007; 257/E25.009; 977/774; 435/6.19; 435/7.1

(58) Field of Classification Search
None
See application file for complete search history.

(56) References Cited

U.S. PATENT DOCUMENTS

| | | | |
|---|---|---|---|
| 6,566,153 B1 | 5/2003 | Yang | |
| 7,132,787 B2 | 11/2006 | Ozkan et al. | |
| 7,326,908 B2 | 2/2008 | Sargent et al. | |
| 7,923,801 B2 | 4/2011 | Tian | |
| 2006/0105523 A1 | 5/2006 | Afzali-Ardakani et al. | |
| 2006/0234059 A1 | 10/2006 | Cella et al. | |
| 2007/0120122 A1 | 5/2007 | Cina | |
| 2007/0132052 A1 | 6/2007 | Sargent et al. | |
| 2007/0160747 A1 | 7/2007 | Mitzi et al. | |
| 2007/0174939 A1 | 7/2007 | Sargent et al. | |
| 2009/0217973 A1 | 9/2009 | Alivisatos et al. | |
| 2010/0019335 A1 | 1/2010 | Ivanov | |
| 2010/0187408 A1 | 7/2010 | Klem | |
| 2010/0213438 A1* | 8/2010 | Cho et al. | 257/13 |
| 2010/0236614 A1 | 9/2010 | Klimov | |
| 2010/0309460 A1 | 12/2010 | Sargent | |
| 2010/0314529 A1* | 12/2010 | Sargent et al. | 250/206 |

(Continued)

FOREIGN PATENT DOCUMENTS

CN 1664633 3/2009

OTHER PUBLICATIONS

Beard et al., "Comparing Multiple Exciton Generation in Quantum Dots to Impact Ionization in Bulk Semiconductors: Implications for Enhancement of Solar Energy Conversion", Nano Letters, 2010, vol. 10, pp. 3019-3027.

(Continued)

Primary Examiner — Steven Loke
Assistant Examiner — Cuong B Nguyen
(74) Attorney, Agent, or Firm — W. LaNelle Owens; John C. Stolpa (57) ABSTRACT A method of forming an optoelectronic device. The method includes providing a deposition surface and contacting the deposition surface with a ligand exchange chemical and contacting the deposition surface with a quantum dot (QD) colloid. This initial process is repeated over one or more cycles to form an initial QD film on the deposition surface. The method further includes subsequently contacting the QD film with a secondary treatment chemical and optionally contacting the surface with additional QDs to form an enhanced QD layer exhibiting multiple exciton generation (MEG) upon absorption of high energy photons by the QD active layer. Devices having an enhanced QD active layer as described above are also disclosed.

11 Claims, 8 Drawing Sheets

(56) References Cited

U.S. PATENT DOCUMENTS

| | | |
|---|---|---|
| 2011/0003279 A1 | 1/2011 | Patel |
| 2011/0146766 A1 | 6/2011 | Nozik et al. |
| 2012/0098028 A1* | 4/2012 | Naito ............................ 257/103 |

OTHER PUBLICATIONS

Beard et al., "Third Generation Photovoltaics: Multiple Exciton Generation in Colloidal Quantum Dots, Quantum Dot Arrays, and Quantum Dot Solar Cells", Photovoltaic Specialists Conference (PVSC), 2010 35th IEEE, Jun. 20-25, 2010, pp. 000370-000375.

Beard, "Multiple Exciton Generation in Semiconductor Quantum Dots", The Journal of Physical Chemistry Letters, 2011, vol. 2, pp. 1282-1288.

Binks et al., "Multiple exciton generation in nanocrystal quantum dots—controversy, current status and future prospects", Physical Chemistry Chemical Physics, Jul. 28, 2011, vol. 13, No. 28, pp. 12661-13136.

Choi et al, "PbSe Nanocrystal Excitonic Solar Cells", Nano Letters, 2009, vol. 9, No. 11, pp. 3749-3755.

Clifford et al., "Schottky Barriers to Colloidal Quantum Dot Films", Applied Physics Letters, Dec. 20, 2007, vol. 91, pp. 253117-1-253117-3.

Ginger et al., "Charge Injection and Transport in Films of CdSe Nanocrystals", Journal of Applied Physics, Feb. 1, 2000, vol. 87, No. 3, pp. 1361-1368.

Guo et al., "Patterned Langmuir-Blodgett Films of Monodisperse Nanoparticles of Iron Oxide Using Soft Lithography", Journal of the American Chemical Society, Dec. 2002, vol. 125, pp. 630-631.

Gur et al., "Air-Stable All-Inorganic Nanocrystal Solar Cells Processed from Solution", Science, Oct. 21, 2005, vol. 310, No. 5747, pp. 462-465.

Gur et al., "Controlled Assembly of Hybrid Bulk-Heterojunction Solar Cells by Sequential Deposition", Journal of Physical Chemistry B, Dec. 21, 2006, vol. 110, pp. 25543-25546.

Hines et al., "Colloidal PbS nanocrystals with Size-Tunable Near-Infrared Emission: Observation of Post-Synthesis Self-Narrowing of the Particle Size Distribution", Advanced Materials, Nov. 4, 2003, vol. 15, No. 21, pp. 1844-1849.

Ho, "Quantum Dots and Ultra-Efficient Solar Cells?", Institute of Science and Technology, ISIS Press Release, Jan. 19, 2006, http://www.i.sis.org.uk/QDAUESC.php?printing=yes, accessed Dec. 9, 2008, pp. 1-4.

Huynh et al., "Charge transport in hybrid nanorod-polymer composite photovoltaic cells", Physical Review B, 2003, vol. 67, pp. 115326-1-115326-12.

Jiang et al., "PbSe Nanocrystal/Conducting Polymer Solar Cells with an Infrared Response to 2 Micron", Journal of Materials Research, Aug. 8, 2007, vol. 22, No. 8, pp. 2204-2210.

Kumar et al., "Colloidal nanocrystal solar cells", Microchimica Acta, 2008, vol. 160, pp. 315-325.

Lin et al., "Size Dependence of the Multiple Exciton Generation Rate in CdSe Quantum Dots", ACS Nano, 2011, vol. 5, No. 4, pp. 2503-2511.

Luque et al., "Solar Cells Based on Quantum Dots: Multiple Exciton Generation and Intermediate Bands", MRS Bulletin, Mar. 2007, vol. 32, pp. 236-241.

Luther et al, "Schottky Solar Cells Based on Colloidal Nanocrystal Films", Nano Letters, 2008, vol. 8, No. 10, pp. 3488-3492.

Luther et al., "Multiple Exciton Generation in Films of Electronically Coupled PbSe Quantum Dots", NANO Letters, 2007, vol. 7, No. 6, pp. 1779-1784.

Luther et al., "Stability Assessment on a 3% Bilayer PbS/ZnO Quantum Dot Heterojunction Solar Cell", Advanced Materials, 2010, vol. 22, pp. 3704-3707.

Luther et al., "Structural, Optical and Electrical Properties of Self-Assembled Films of PbSe Nanocrystals Treated with 1, 2-Ethanedithiol", ACS NANO, Jan. 21, 2008, pp. A-J.

Luther, "Nanocrystalline Photovoltaic Devices for Multiple Exciton Generation", Thesis: Oral Defense given on Dec. 2007, Colorado School of Mines, pp. 1-132.

Murphy et al., "Time-Resolved Photoconductivity of PbSe Nanocrystal Arrays", Journal of Physical Chemistry B, 2006, vol. 110, No. 50, pp. 25455-25461.

Nozik et al., "Carrier Dynamics and Multiple Exciton Generation in Nanocrystals: Applications to 3rd Generation Solar Photon Conversion", NREL/DOE, 2008.

Nozik et al., "Semiconductor Quantum Dots and Quantum Dot Arrays and Applications of Multiple Exciton Generation to Third-Generation Photovoltaic Solar Cells", Chemical Reviews, 2010, vol. 110, No. 11, pp. 6873-6890.

Nozik, "Quantum Dot Solar Cells", Physica E., No. 14, Apr. 2002, pp. 115-120.

Nozik, "Multiple exciton generation in semiconductor quantum dots", Chemical Physics Letters, 2008, vol. 457, pp. 3-11.

Nozik, "Multiple exciton generation in semiconductor quantum dots and novel molecules: Applications to third generation solar photon conversion:", Applications of Ferroelectrics, 2008. ISAF 2008. 17th IEEE International Symposium, Feb. 23-28, 2008, pp. 1-2.

Talapin et al., "PbSe Nanocrystal Solids for n- and p-Channel Thin Film Field-Effect Transistors", Science, Oct. 7, 2005, vol. 310, No. 5745, pp. 86-89.

Zukalová et al., "Organized Mesoporous TiO2 Films Exhibiting Greatly Enhanced Performance in Dye-Sensitized Solar Cells", NANO Letters, 2005, vol. 5, No. 9, pp. 1789-1792.

United States Patent and Trademark Office issued Non-final Rejection for U.S. Appl. No. 12/359,487; Notification Date Sep. 2, 2011, pp. 1-19.

United States Patent and Trademark Office issued Final Rejection for U.S. Appl. No. 12/359,487; Notification Date Feb. 29, 2012, pp. 1-30.

United States Patent and Trademark Office issued Non-final Rejection for U.S. Appl. No. 12/359,487; Notification Date Feb. 4, 2013, pp. 1-26.

United States Patent and Trademark Office issued Final Rejection for U.S. Appl. No. 12/359,487; Notification Date Jun. 4, 2013, pp. 1-29.

Nelson, "Photons In, Electrons Out: The Photovoltaic Effect", from The Physics of Solar Cells, Imperial College, UK, May 2003, Chapter 1.1, pp. 1-16.

* cited by examiner

SECONDARY TREATMENT OF FILMS OF COLLOIDAL QUANTUM DOTS FOR OPTOELECTRONICS AND DEVICES PRODUCED THEREBY

CONTRACTUAL ORIGIN

The United States Government has rights in this invention under Contract No. DE-AC36-080028308 between the United States Department of Energy and the Alliance for Sustainable Energy, LLC, the manager and operator of the National Renewable Energy Laboratory.

BACKGROUND

An important long range objective of solar energy research is the discovery and development of photoconversion materials, processes, and architectures that can produce solar generated electricity at costs competitive with the cost of electricity generated from fossil fuels such as petroleum, natural gas, or coal. In general, solar electricity systems will require relatively high conversion efficiencies and such systems must be relatively inexpensive to produce to become cost competitive with fossil fuel.

A photovoltaic device, commonly referred to a solar cell or solar panel, is a type of optoelectronic device that converts incident sunlight into electrical current which may then be used to power any type of electrical system or stored in a storage device such as a battery. Semiconductor materials in bulk form currently dominate the field of commercial photovoltaic (PV) power. More sophisticated materials and architectures having higher efficiencies are being developed.

Colloidal Quantum Dots (referred to herein as QDs) are one material being developed for use in solar cells, photovoltaic devices or other optoelectronics. Colloidal QDs are also known as nanocrystals (referred to herein as NCs). QDs and/or NCs are believed to be inherently well suited for the development of relatively inexpensive higher efficiency solar cells for several reasons, including but not limited to observations that QD materials are in certain instances relatively inexpensive and that these materials exhibit an enhanced capacity for multiple exciton generation (MEG).

In particular, the spatial confinement of electrons and holes in QDs and other NCs causes several important effects: (1) $e^-$ and $h^+$ pairs are correlated and thus exist as excitons rather than free carriers, (2) the rate of exciton cooling can be slowed because of the formation of discrete electronic states, (3) momentum is not a good quantum number and thus the need to conserve crystal momentum is relaxed and (4) Auger processes are greatly enhanced because of increased $e^-$-$h^+$ Coulomb interaction. Because of these factors it has been observed that the production of multiple $e^-$-$h^+$ pairs (excitons) from high energy photons can be enhanced in QDs compared to bulk semiconductors of the same compositon.

Nonetheless, known solar cells employing a QD active layer typically exhibit relatively low conversion efficiencies. The observed lower conversion efficiencies have many causes. One observed reason for the lower conversion efficiencies observed in QD solar cells is that solar cells fabricated with a QD active layer typically do not exhibit MEG.

The methods and devices disclosed herein are directed toward overcoming one or more of the problems discussed above. The foregoing examples of the related art and limitations related therewith are intended to be illustrative and not exclusive. Other limitations of the related art will become apparent to those of skill in the art upon a reading of the specification and a study of the drawings.

SUMMARY OF THE EMBODIMENTS

The following embodiments and aspects thereof are described and illustrated in conjunction with systems, tools and methods which are meant to be exemplary and illustrative, not limiting in scope. In various embodiments, one or more of the above-described problems have been reduced or eliminated, while other embodiments are directed to other improvements.

One embodiment includes a method of forming an optoelectronic device. The method includes providing a deposition surface and alternately contacting the deposition surface with a ligand exchange chemical and contacting the deposition surface with a quantum dot (QD) colloid. This initial process is repeated over one or more cycles to form an initial QD film on the deposition surface. The method further includes subsequently contacting the QD film with a secondary treatment chemical.

Generally, two types of secondary treatment processes may be followed. The first type of secondary treatment comprises alternately contacting the initial QD film with a secondary treatment chemical and contacting the deposition surface with a QD colloid. Secondary treatment may be performed over one or more cycles to deposit additional QDs on the initial QD film. The secondary treatment chemical can be one of the following: hydrazine, formic acid, mercaptopropionic acid, another organic acid, methylamine, methanol, ethanol, ethylenediamine or similar chemicals. One characteristic of the secondary treatment step is that these processes restore or impart the capacity of MEG to the QD film, which capacity or attribute is typically not present after the initial QD film formation steps.

The initial QD film may be formed to any desired thickness. Useful films have been formed to a thickness of about 40 nm to 400 nm. The initial QD film is thickened by about 1 nm to 50 nm by the deposition of additional QDs in the first type of secondary treatment step.

Alternatively or in addition to the above, secondary treatment of an active layer of an optoelectronic device may include contacting the initial QD film with a secondary treatment chemical over one or more cycles without depositing additional QDs on the QD film.

An alternative embodiment is a method of forming a solar cell including the steps of providing a substrate, forming a first electrode, a conductive window layer or other conductive surface in contact with the substrate and alternately contacting the first electrode with a ligand exchange chemical and a quantum dot (QD) colloid over one or more cycles to form an initial QD film in contact with the first electrode. The method further includes contacting the initial QD film with a secondary treatment chemical and then forming a second electrode in contact with the initial QD film, with the second electrode not being in contact with the first electrode.

The step of contacting the initial QD film with a secondary treatment chemical may include alternately contacting the initial QD film with a secondary treatment chemical and contacting the deposition surface with a quantum dot (QD) colloid over one or more cycles to deposit additional QDs on the initial QD film. In this embodiment the initial QD film is thickened by about 1 nm to 50 nm by the deposition of additional QDs in the secondary treatment step.

Alternatively, the secondary treatment step may include contacting the QD film with a secondary treatment chemical over one or more cycles without depositing additional QDs on the QD film. In either case, the secondary treatment chemical can be one of the following: hydrazine, formic acid, mercaptopropionic acid, another organic acid, methylamine, methanol, ethanol, ethylenediamine or similar chemicals. One characteristic of the secondary treatment chemical is that it restores or imparts the capacity of multiple exciton generation (MEG) to the QD film, which capacity is typically not present after the initial film formation steps.

The method of forming a solar cell may further include forming any number of additional device layers as desired to make a functional cell. For example, a doped window layer may be formed in electrical contact with the first electrode and the QD film.

An alternative embodiment is an optoelectronic device, for example a solar cell having a QD active layer formed as described above. A typical device may include a first electrode; a QD active layer in electrical contact with the first electrode and a second electrode in electrical contact with the QD active layer. Any number of additional layers or structures may be included in the device to enhance device efficiency or overall performance. In all cases the QD active layer will provide for multiple exciton generation (MEG) upon absorption of high energy photons by the QD active layer.

Device embodiments may include a QD active layer comprising at least one of QDs of lead selenide (PbSe), lead sulfide (PbS), cadmium selenide (CdSe), other semiconductor nanocrystals (NCs), core-shell and ternary nanocrystals, for example lead telluride (PbTe), lead selenide sulfide (PbSSe), lead selenide core with lead sulfide shell, cadmium lead sulfide (CdPbS), cadmium lead selenide (CdPbSe) tin sulfide (SnS), tin selenide (SnSe), tin telluride (SnTe), silicon (Si), germanium (Ge), indium arsenide (InAs), indium phosphide (InP), indium antimonide (InSb), gallium arsenide (GaAs), indium gallium arsenide (InGaAs) and NC structures of all other Group III-V, IV, II-VI, IV-VI compounds and alloys.

In addition to the exemplary aspects and embodiments described above, further aspects and embodiments will become apparent by reference to the drawings and by study of the following descriptions.

BRIEF DESCRIPTION OF THE DRAWINGS

Exemplary embodiments are illustrated in referenced figures of the drawings. It is intended that the embodiments and figures disclosed herein are to be considered illustrative rather than limiting.

DETAILED DESCRIPTION

Unless otherwise indicated, all numbers expressing quantities of ingredients, dimensions, reaction conditions and so forth used in the specification and claims are to be understood as being modified in all instances by the term "about".

In this application and the claims, the use of the singular includes the plural unless specifically stated otherwise. In addition, use of "or" means "and/or" unless stated otherwise. Moreover, the use of the term "including", as well as other forms, such as "includes" and "included," is not limiting. Also, terms such as "element" or "component" encompass both elements and components comprising one unit and elements and components that comprise more than one unit unless specifically stated otherwise.

Optoelectronic devices exploit photovoltaic or photoelectric effects caused when light energy is absorbed or emitted by certain semiconducting materials. Optoelectronic devices include but are not limited to photodiodes including solar cells, phototransistors, photomultipliers, photoresistors, LEDs, laser diodes and other types of devices. The methods and embodiments disclosed herein can be adapted to many types of optoelectronic devices. The specific embodiments described herein involve photovoltaic solar cell fabrication methods and devices. The scope of this disclosure however is intended to cover all suitable optoelectronics whether or not a type of optoelectronic device is described specifically herein.

Electricity can be produced from photovoltaic (PV) cells also known as solar cells having a semiconductor photoconverter layer of greater or lesser efficiency. Exemplary methods and device embodiments disclosed herein describe how relatively higher conversion efficiencies and multiple exciton generation (MEG) can be obtained for solar photovoltaic cells using active regions composed of colloidal quantum dots (QDs), also known as nanocrystals (NCs). As defined herein a QD or NC is a structure where the spatial confinement of electrons and holes causes the e$^-$ and h$^+$ pairs generated by a photonic effect to be correlated and thus exist initially as excitons rather than free carriers. For practical application in a photovoltaic cell the excitons must be subsequently dissociated into free electrons and free holes and spatially separated.

Figure 1:
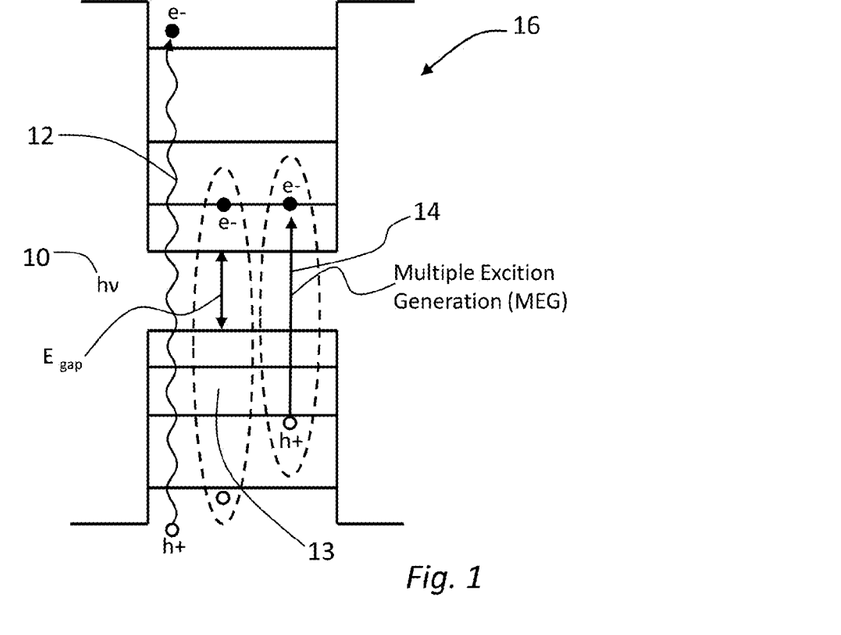
FIG. 1 is a schematic diagram showing Multiple Exciton Generation (MEG) in a quantum dot.

The spatial confinement of electrons and holes in QDs and other NCs causes several important effects: (1) e$^-$ and h$^{30}$ pairs are correlated and thus exist as excitons rather than free carriers, (2) the rate of exciton cooling can be slowed because of the formation of discrete electronic states, (3) momentum is not a good quantum number and thus the need to conserve crystal momentum is relaxed, and (4) Auger processes are greatly enhanced because of increased e$^-$-h$^+$ Coulomb interaction. Because of these factors it has been observed that the production of multiple e⁻-h⁺ pairs (excitons) can be enhanced in QDs compared to bulk semiconductors. Therefore, both the threshold energy ($hv_{th}$) for electron hole pair multiplication (EHPM) and its efficiency, $\eta_{EHPM}$ (defined as the number of excitons produced per additional bandgap of energy above the EHPM threshold energy) are expected to be greatly enhanced in QD type material. The formation of multiple excitons is denominated herein as Multiple Exciton Generation (MEG). The possibility of enhanced MEG in QDs was first proposed in 2001. The original concept is illustrated in FIG. 1, where a single photon 10 is shown creating an excited e⁻-h⁺ pair 12. This pair generates an exciton 14 and also remains as exciton 13. Thus, one high energy photon has directly created multiple exciton pairs within the confined structure of a QD 16.

Known solar cells produced with QD active layers have typically not been observed to exhibit MEG. In particular, solar cells having a QD active layer produced by a layer by layer deposition process as disclosed in US Published Patent Application 2011/0146766 A1 "Solar Cells Based Upon Quantum Dot or Colloidal Nanocrystal Films," do not exhibit clearly detectable MEG. The entire disclosure of the 2011/0146766 A1 application is incorporated herein by reference for all matters disclosed therein. Specific secondary treatments and additional processing steps disclosed in detail herein can be used to create solar cells with a QD active layer that unambiguously exhibits MEG.

An exemplary device may employ a QD layer that is the light-absorbing layer in a photovoltaic solar cell. As used herein a QD "layer" is synonymous with a QD "film." An exemplary but highly simplified solar cell may be formed with a first conductive electrode of any type. In some examples, an indium tin oxide (ITO) layer may be the first electrode and in other examples an appropriate thin metal layer or a doped bulk semiconductor layer may be the first electrode. The first electrode and other layers may be supported on a substrate such as glass. A second electrode of some type is required as well. The first and second electrodes serve to collect electrons and holes formed in the QD active layer to generate current. Any number of additional layers including doped window layers, encapsulant layers or other layers may be included in a working device. In general, a highly simplified QD solar cell device requires two electrodes and a relatively dense layer active layer of QDs in contact with the electrodes. As used herein, "in contact with" means in electrical contact with other layers, although there may exist any number of intervening layers between the two layers described as being in contact with each other.

The room temperature layer by layer deposition methods described herein results in the fabrication of a dense QD film without structural stress, leading to a pinhole and crack-free film of electronically coupled quantum dots. At least one of the first and second electrodes must be substantially transparent to sunlight. All layers may be mechanically supported, typically by a substrate which may also be substantially transparent to relevant wavelengths of light.

Under illumination through one electrode, photons are absorbed in the QD film thereby generating excitons which are then dissociated by the electric fields present in the photoactive quantum dot layer. The separated electrons and holes are transported to separate cathodic and anodic electrodes to produce a photovoltaic effect. The electric field in the QD layer could be produced through a Schottky junction formed between the QD film and the top contact layer or by a more complex architecture, for example the use of two different metal layers with different work functions operating as the two electrodes of the cell, or by doped semiconductor layers of opposite conductivity type operating as the electrodes or through a combination of other known solar cell architectures. More sophisticated electrode arrangements may improve charge collection and hence the conversion efficiency of a QD based solar cell. The methods and devices disclosed herein are not limited to any particular cell architecture configuration.

Figure 2:
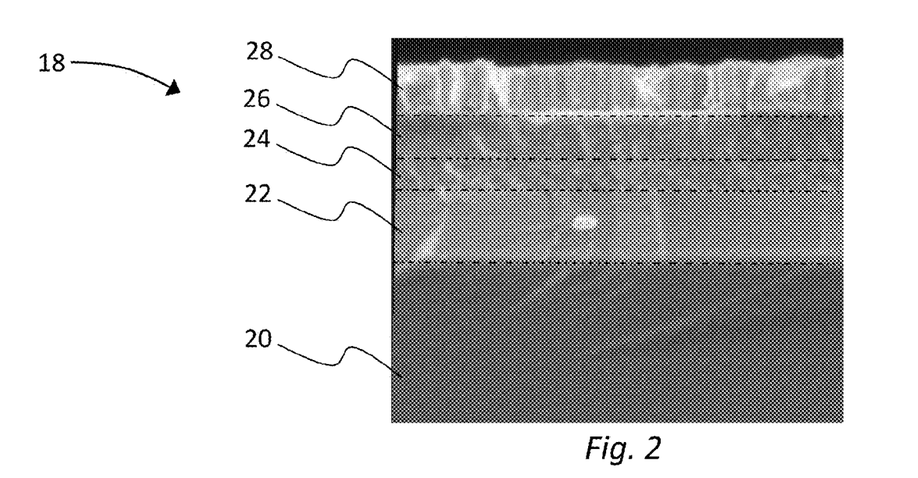
FIG. 2 is cross sectional SEM showing the layers of an exemplary device.

An exemplary device having a QD film active layer is illustrated in the cross-sectional SEM image of a solar cell structure of FIG. 2. The exemplary device 18 includes a substantially transparent glass or other suitable substrate 20 with an indium tin oxide (ITO) electrode 22 deposited on the substrate. It is important to note that the substrate 20 could be implemented with any material having the ability to transmit sunlight and exhibit suitable mechanical characteristics. Similarly the ITO electrode could be implemented with another type of substantially transparent material having suitable conductivity or implemented in multiple layers.

The illustrated device 18 also includes an n-type window layer 24 of ZnO or another suitable, substantially transparent, semiconductor with n-type doping. Alternatively, the electrode and doped window layer could be the same layer assuming the layer exhibited the desired electrical characteristics. As described in detail below, the illustrated architecture works well, but the methods disclosed herein are not limited to devices having this architecture. Also shown in FIG. 2 are a PbSe QD layer 26 formed according to an enhanced deposition method as disclosed herein. The device also includes a top contact 28. In the FIG. 2 embodiment the top contact 28 is representative of the second electrode described above and in particular is an Au layer deposited by known deposition techniques. Other top contact materials could have been used. The device 18 could also include any number of additional layers including but not limited to encapsulant layers or additional window layers.

The QD layer 26 could be formed with any QD or NC material fabricated or treated using the enhanced methods described herein. For example, the QD layer could be composed of QDs of lead selenide (PbSe), lead sulfide (PbS), cadmium selenide (CdSe), other semiconductor NCs, core-shell and ternary nanocrystals, for example lead telluride (PbTe), lead selenide sulfide (PbSSe), lead selenide core with lead sulfide shell, cadmium lead sulfide (CdPbS), cadmium lead selenide (CdPbSe) tin sulfide (SnS), tin selenide (SnSe), tin telluride (SnTe), silicon (Si), germanium (Ge), indium arsenide (InAs), indium phosphide (InP), indium antimonide (InSb), gallium arsenide (GaAs), indium gallium arsenide (InGaAs) and NC structures of all other Group III-V, IV, II-VI, IV-VI compounds and alloys.

Figure 3:
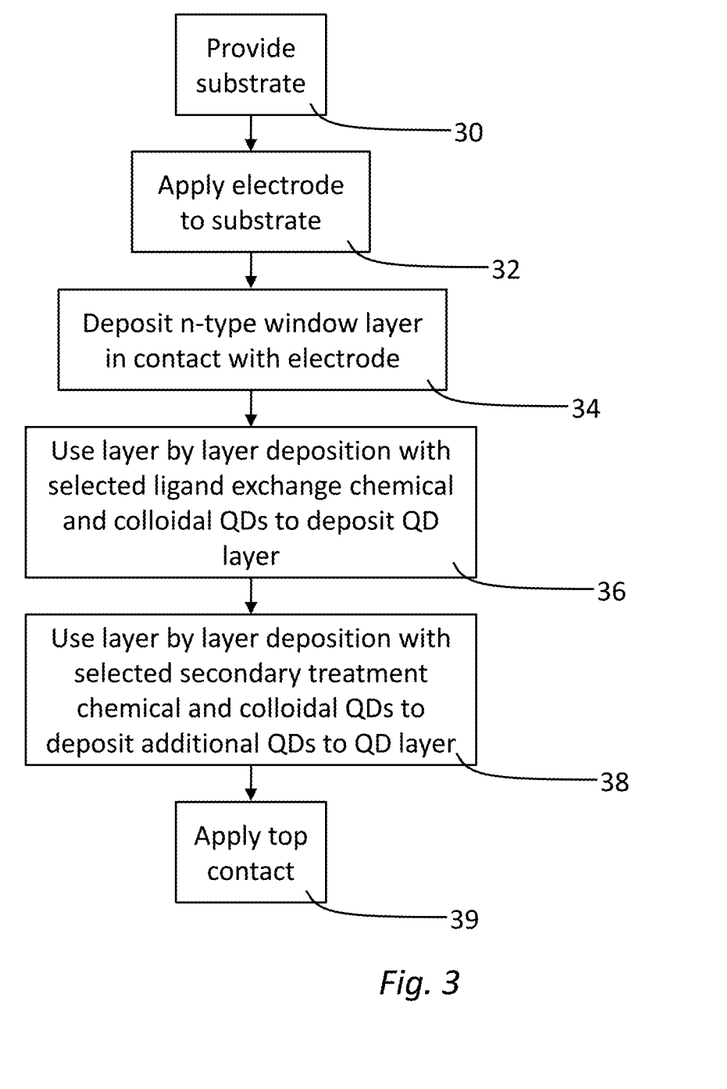
FIG. 3 is a flowchart representation of a disclosed method.
Figure 4:
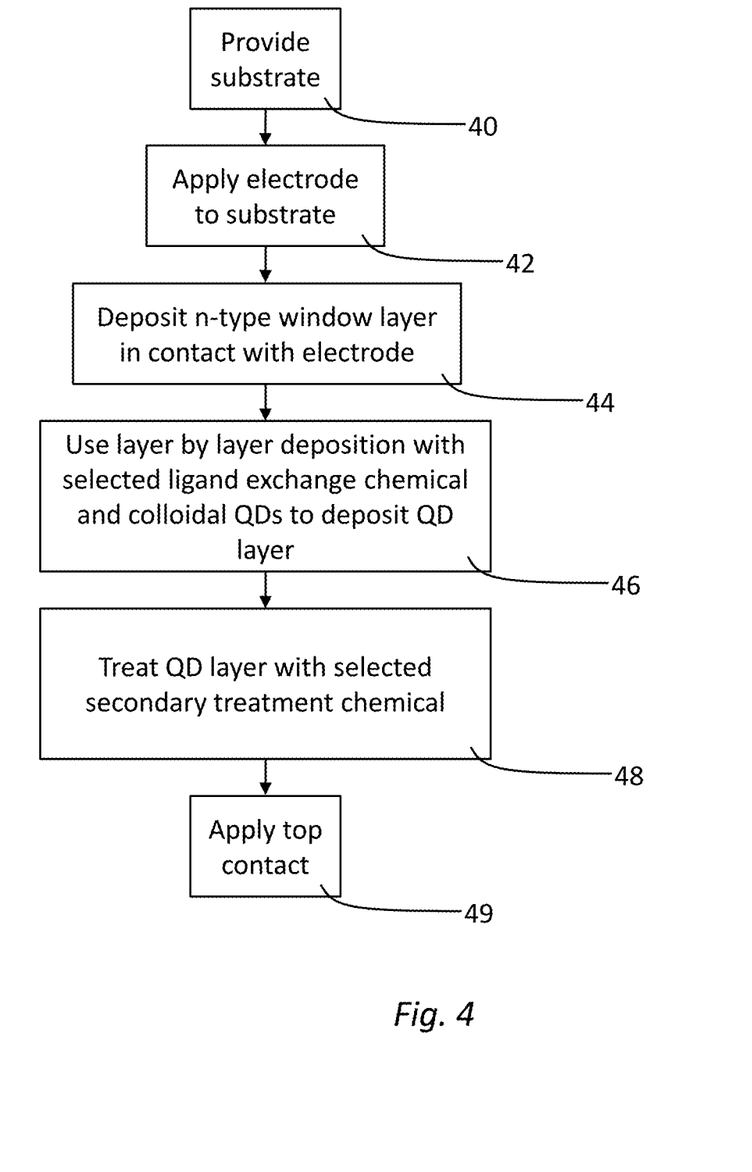
FIG. 4 is a flowchart representation of an alternative disclosed method.

Generally, as shown in the flow charts of FIGS. 3 and 4, a device 18 may be fabricated on a glass substrate 20 with an ITO electrode 22 deposited thereon (Steps, 30, 32 and 40, 42). The substrate and electrode may be obtained commercially or manufactured by known techniques. An n-type window layer 24 is deposited or otherwise associated with the substrate and ITO layer by known techniques (Step 34, 44). The substrate, electrode and window layer may then be cleaned and dried under nitrogen flow and moved into a glovebox for further room temperature processing.

The QD film 26 is added to the structure according to an enhanced layer by layer deposition processes as disclosed herein. Certain steps included in the enhanced deposition processes are illustrated in FIG. 3 and FIG. 4. Each enhanced layer by layer deposition process initially includes contacting the deposition surface of a device (and the developing QD layer) with a selected ligand exchange chemical and contacting the device and developing QD layer with colloidal QDs to deposit an initial QD layer (step 36 and 46). The order in which the device is contacted with the ligand exchange chemical and colloidal QDs can be varied. In addition, it is not required that the device or deposition surface be contacted with each fluid the same number of times or for the same total time.

As used herein, the term "contacting" is defined as any method of physically bringing the ligand exchange chemical or colloidal QDs into contact with the developing QD layer. The most basic method of contacting the device with a ligand exchange chemical or colloidal QDs involves dipping or submerging the device in a container of the appropriate fluid. Alternative methods of contacting the device with a ligand exchange chemical or colloidal QDs include but are not limited to spraying techniques, flowing fluid across the QD film or jet printing techniques. Any number of layer by layer deposition cycles may be performed to develop an initial QD film of a desired thickness, for example, between 40 nm and 400 nm. 100 nm has been observed to be an initial QD film of suitable thickness.

After the initial layer by layer deposition steps have created the initial QD film, a selected secondary treatment process is performed. The process of FIG. 3 includes the steps of contacting the initial QD film with a secondary treatment chemical and contacting the QD film with additional colloidal QDs in subsequent layer by layer deposition cycles to deposit additional QDs to the initial QD layer (step 38). The additional QDs deposited in secondary treatment may increase the QD layer thickness by any desired thickness; however the additional thickness is typically less than the initial layer thickness. For example, the additional QDs deposited in secondary treatment can add from 1 nm to 50 nm of additional QD layer thickness.

An alternative enhanced deposition process is illustrated in FIG. 4. The alternative enhanced layer by layer deposition process begins with initial layer by layer deposition using a selected ligand exchange chemical and colloidal QDs to deposit an initial QD layer as described above (step 46). In this embodiment however, the initial deposition steps are followed by the treatment of or contacting the initial QD layer with at least one selected secondary treatment chemical without adding additional QDs (step 48). The methods of FIGS. 3 and 4 could be combined so that the enhanced deposition of QDs includes both the deposition of additional QDs to the initial QD layer using a secondary treatment chemical followed by or preceded by secondary treatment without the addition of supplemental QDs.

More specifically, the initial layer by layer process begins by obtaining or preparing a quantity of QDs fabricated to have a selected absorption peak and colloidally suspended in hexane or another suitable fluid. For the purpose of initial ligand exchange, a supply of a ligand exchange chemical, for example 1,2 ethanedithiol (EDT) dissolved in degassed acetonitrile is provided. Other nucleophillic molecules can be used instead of EDT as a ligand exchange chemical, including but not limited to methylamine, benzenedithiol, ethanethiol, ethylenediamine, butylamine, or benzenediamine.

In addition, a quantity of a secondary treatment chemical, possibly also dissolved in degassed acetonitrile or another solvent is obtained. The secondary treatment chemical may be hydrazine, formic acid or another larger organic acid, for example mercaptopropionic acid, methylamine, methanol, ethanol, ethylenediamine or some other chemical which provides suitable secondary treatment, as described herein.

According to one specific process, initial room-temperature layer by layer deposition occurs by submerging or otherwise contacting the device with the ligand exchange fluid, for example ethane dithiol (EDT), for a short time and then removing the structure. The surface is allowed to dry, which takes a short time. The device is then submerged or otherwise contacted with the colloidal QD solution. The device is removed, allowed to completely dry and then resubmerged in the EDT solution. The process of dipping the structure in the colloidal QD, removing it, and treating it with EDT is repeated for a number of times (in some examples, a total of 8 times, in other examples, up to 20 or more times), until the substrate is darkly colored with the desired thickness of initial QD layer. As noted above variations in the timing, length or order of the dipping or contacting steps are within the scope of the present disclosure.

After a suitably thick initial layer of QDs has been deposited, the disclosed method will include at least one of the two secondary processes noted above. In one instance, as shown on FIG. 3, additional QDs may be deposited by submerging or otherwise contacting the substrate and associated layers with a secondary treatment fluid, for example hydrazine, formic acid or another larger organic acid for example mercaptopropionic acid, methylamine, methanol, ethanol, ethylenediamine. The structure may then be removed and allowed to dry. Then the structure may be submerged in the colloidal QD supply, allowed to dry and re-submerged in the secondary treatment chemical. This process may be repeated until a quantity of additional QDs is deposited on the QD layer. The back and sides of the substrate may then be cleaned and a suitable top contact added (step 39).

Alternatively, the initially deposited QD layer may be submerged or otherwise contacted with a secondary treatment chemical for a selected time and over a selected number of repetitions, without resubmerging the device in the QD colloid or otherwise adding additional QDs to the QD layer. After secondary treatment has been completed, the back and sides of the substrate may be cleaned and a suitable top contact and any other desired device layer added (step 49).

The enhanced room-temperature layer by layer deposition techniques described above overcome several technical challenges presented by the fabrication of a suitable QD layer. In particular, long-chain aliphatic ligands, such as oleic acid, are used in the synthesis of QDs to control growth kinetics, and allow for stable colloidal dispersions. In addition, the use of long chain aliphatic ligands passivates the QD surface states through metal-ligand chemistry. However, long chain aliphatic ligands, if present in deposited QD films, create a large barrier to electronic transport. The use of a ligand exchange chemical or a secondary treatment chemical as described above during deposition substantially removes the long chain aliphatic ligand barriers while maintaining or improving surface passivation and controlling the electrical properties of the resulting film.

Previously prepared cells using only ligand exchange chemicals such as EDT did not unambiguously exhibit MEG however. The failure of the known devices prepared in a one step, ligand replacement chemical only, layer by layer deposition process to exhibit MEG can be deduced from the analysis of the quantum efficiency of the devices and determined directly through spectroscopic measurements. In addition, although it is known that hydrazine treated PbSe QD films exhibit superior electron mobilities, on the order of 1 cm$^2$ V$^{-1}$ s$^{-1}$, no reports are known showing the successful incorporation of a hydrazine treated QD layer into a QD solar cell. Previous attempts using hydrazine as an initial ligand replacement chemical have produced non-working devices.

The disclosed enhanced chemical treatments and enhanced fabrication methods have important effects including but not limited to producing QD layers which unambiguously exhibit MIG and other enhanced electrical characteristics. This is an important breakthrough in the development of QD based devices since extracting multiple carriers per absorbed high-energy photon could have a dramatic impact on solar energy conversion technologies. Quantum confinement can increase the ability of a material to convert high-energy photons to multiple charge carriers and ultrafast transient absorption measurements have demonstrated that MEG has about twice the efficiency in isolated PbSe QDs when compared to bulk PbSe. The following example provides detailed analysis of three selected QD solar cells prepared according to the disclosed methods. The following example is provided for illustrative purposes only and is not intended to limit the scope of the embodiments disclosed herein.

EXAMPLE

Solar cells were prepared having the architecture described above and shown in FIG. 2, Specifically, the tested structures consist of a 40-60 nm ZnO n-type window layer deposited on top of a glass/ITO transparent front electrode, a 50-250 nm thick PbSe QD layer and a gold anode thermally evaporated onto the PbSe QD layer. The PbSe QD layer for the tested devices was alternatively prepared for a given device by selecting from three sizes of QD. The selected QDs have size dependent bandgaps ($E_g$). The smallest QDs have $E_g$=0.98 eV, the medium sized QDs have $E_g$=0.0.83 eV and the larger sized QDs have $E_g$=0.72 eV. Thus, three varieties of the same general solar cell architecture were fabricated and tested with the difference between devices being the size of the QDs incorporated into the QD active layer creating devices having three distinct active layer bandgaps for testing.

The QD-layer formation protocol for the example cells began with the initial deposition of 50-250 nm of PbSe QDs with layer-by-layer EDT treatment as described above, followed by a secondary treatment comprised of the deposition of approximately 30 nm of additional QDs, using 1M hydrazine in acetonitrile as a secondary treatment chemical in place of the EDT. The devices were finished with evaporated gold electrodes. The junction in the described devices is located close to the n-type window layer. The selected heterojunction architecture facilitates extraction of charge-carriers produced from high-energy photons, which are mostly absorbed about 50 nm into the PbSe film.

The ZnO n-type window layer was deposited via a sol-gel spin-coating process using diethylzinc as a precursor in air. Previous work on ZnO/PbSe heterojunctions has shown that the valence band maximum is determined by sub-states in the ZnO, regardless of QD size, and that electron injection into the ZnO should be blocked for PbSe QDs with bandgaps less than approximately 0.7 eV. This observation was confirmed herein. Solar cells made from the QDs with the smallest bandgap show a much lower $V_{oc}$ as described below.

Figure 5:
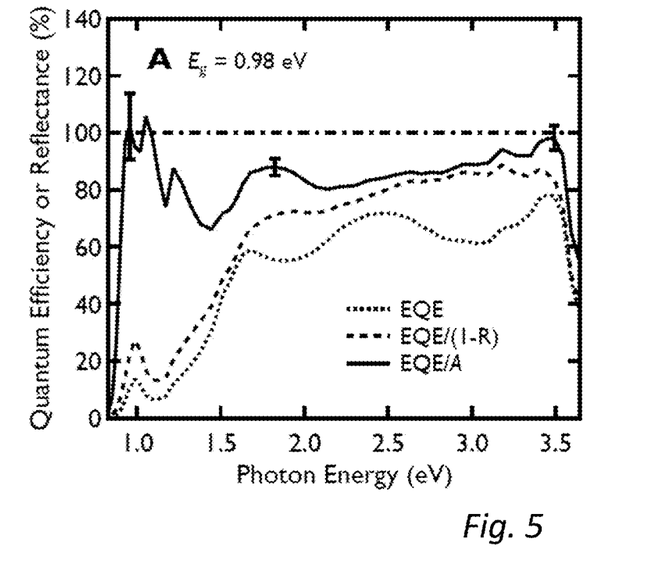
FIG. 5 is a graph showing the spectral response of PbSe QD devices made with coupled-film bandgaps of 0.98 eV.
Figure 6:
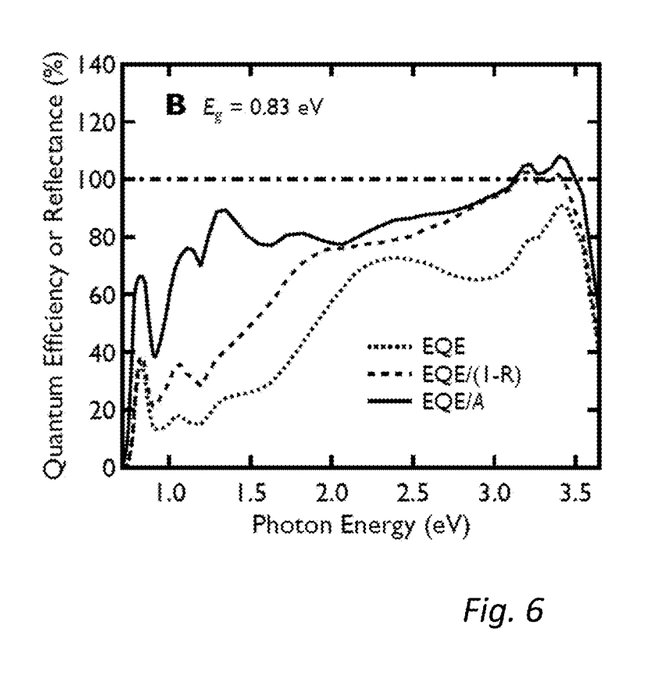
FIG. 6 is a graph showing the spectral response of PbSe QD devices made with coupled-film bandgaps of 0.83 eV.
Figure 7:
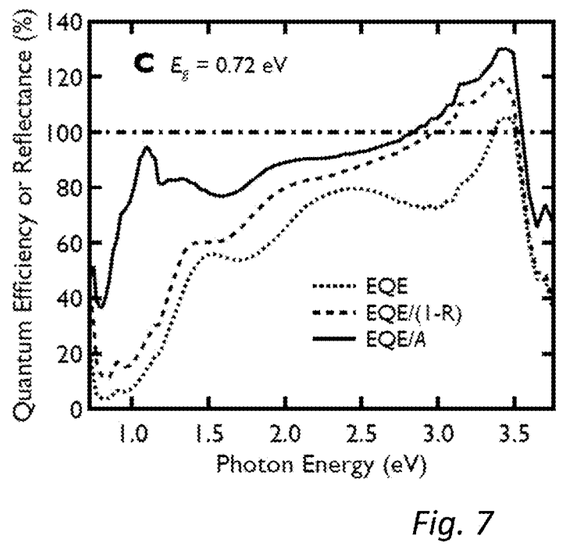
FIG. 7 is a graph showing the spectral response of PbSe QD devices made with coupled-film bandgaps of 0.72 eV.

FIGS. 5-7 graphically illustrate the spectral response of the PbSe QD devices made as described above with a coupled-film bandgap of 0.98 eV (FIG. 5), 0.83 eV (FIG. 6) and 0.72 eV (FIG. 7). On each graph, the external quantum efficiency (EQE) is shown with dotted curves, EQE/(1−R) where R is the reflectance measured using an integrating sphere, to include diffuse reflectance, is shown with dashed curves, and EQE/A is illustrated with solid curves, where A is the modeled absorptance of the PbSe and ZnO layers.

Both the reflectance and EQE spectra of the devices exhibit significant interference fringes indicating the buildup of optical modes within the dielectric stack. These fringes depend upon the thickness of each layer and a rigorous optical model using ellipsometric measurements was employed to extract the internal quantum efficiency (IQE). Despite reflection and absorption by the glass, ITO, and ZnO layers prior to incident light reaching the QD layer, as shown on FIG. 7, the EQE reaches 106±3% for the largest sized QDs ($E_g$=0.72 eV) at 3.5 eV photon energy which confirms that the cells exhibit MEG. The accuracy of the foregoing results was verified by measuring the EQE of a Thorlabs FDS-100-CAL silicon photodiode, and comparing said measurement against the calibration given by Thorlabs.

All photons not absorbed within the described solar cells are reflected, so an initial determination of the QE of a device can be determined by dividing the measured EQE by 1−R. Since the back contact of the tested devices is a gold film, no light is transmitted through the back. The EQE/(1−R) trace of FIGS. 5-7 represents a lower limit to the actual IQE of a given class of device since this curve does not account for light absorbed by other layers that do not contribute to photocurrent. For example, the large absorption of ITO in the near infrared region leads to the decrease of the EQE at photon energies of below 2 eV. The absorption within each layer of the structure was determined by comparing the measured reflectance to that calculated from an optical model using the experimentally determined complex refractive index (N=n+ ik) of each component layer as inputs.

Normalizing the EQE to the calculated absorption yields the IQE of the active layer:

$$IQE = \frac{EQE}{A},$$

where the absorptance $A=A_{PbSe}+A_{ZnO}$ is produced by the optical model. The ZnO absorption is included to make a conservative estimate of the device IQE, since it has not been determined if photons absorbed within the ZnO layer contribute to the photocurrent. This IQE, labeled as EQE/A, is plotted for each of the solar cells shown in FIGS. 5-7. Near the bandgap there is significant statistical variation, which can lead to improbable IQE values, such as those observed around 1 eV for the 0.98 eV solar cell of FIG. 5, however, the variation is significantly smaller in the visible and ultraviolet portion of the spectrum.

The IQE curves of FIGS. 5-7 exhibit short-circuit collection yields of around 85%, until the photon energy surpasses the MEG threshold, where the IQE rises to a peak efficiency of 130% for the 0.72 eV QD cell (FIG. 7), 108% for the 0.83 eV QD cell (FIG. 6), and 98% for the 0.98 eV QD cell (FIG. 5). The glass, ITO and ZnO begin to absorb significant light at photon energies greater than 3.5 eV, and the EQE and IQE drop sharply.

Figure 8:
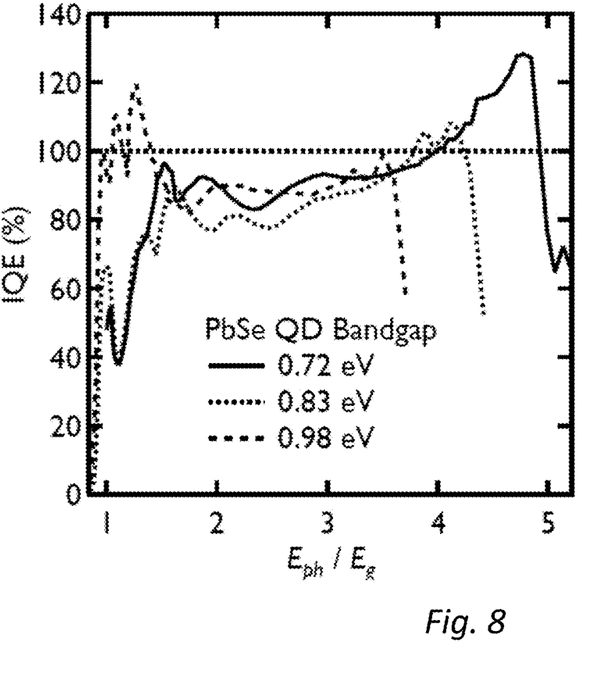
FIG. 8 is a graph showing collected IQE curves versus the photon energy divided by the bandgap, $E_{ph}/E_g$, for the three QD sizes of FIGS. 5-7.

To assess MEG efficiency, $\eta_{MEG}$ the IQE curves of FIGS. 5-7 can be plotted versus the photon energy ($E_{ph}$) normalized to the bandgap ($E_g$) of the QD layer, $E_{ph}/E_g$. This plot is illustrated in FIG. 8. It is notable that the IQE curves for different sized QDs are similar on an $E_{ph}/E_g$ basis, indicating that the capacity to convert high-energy photons to multiple excitons is mainly determined by the excess energy relative to the fundamental energy required to create an exciton. In coupled QD films, the bandgap energy red-shifts by 50-100 nm, therefore normalization may be made to the coupled-film bandgap, as determined by the peak of the first optical transition seen in the EQE, instead of the first transition observed in a colloidal solution of isolated QDs.

Figure 9:
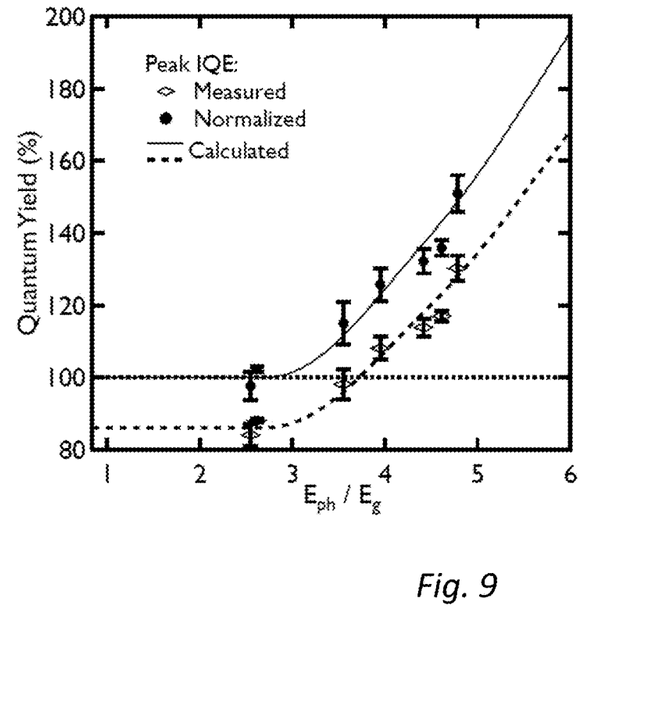
FIG. 9 is a graph showing peak IQE values from a set of devices (including those of FIGS. 5-7) made from seven different QD sizes, plotted versus $E_{ph}/E_g$. Also plotted are the peak IQE values corrected for intrinsic losses in the solar cell.

The measured peak IQE for each QD size at the appropriate $E_{ph}/E_g$ value is illustrated in FIG. 9. A clear trend is shown that agrees with spectroscopic measurements despite a difference of about 15% due to intrinsic photocurrent losses. The IQE curves of the two devices using larger bandgap QDs have their peak quantum yield (QY) at photon energies below the MEG-threshold and thus can be used to approximate the intrinsic photocurrent losses. These losses may be attributed to electron-hole recombination before carrier separation and collection as photocurrent, and therefore the measured IQE may be normalized to these values, as shown by black dots on FIG. 9. These normalized values compare with a model that accounts for a competition between MEG and hot-exciton cooling, shown as the solid black curve in FIG. 9. This curve may also be normalized as above for intrinsic recombination losses, and shown as the dashed black curve. A least-squares linear fit of a normalized version of the model may be applied to the IQE for the 0.72 eV cell, yielding $\eta_{MEG}=0.62\pm0.01$, and an MEG onset threshold, $E_{th}$ of:

$$E_{th} = \left(1 + \frac{1}{\eta_{MEG}}\right)E_g = (2.61 \pm 0.03)E_g$$

The above analysis shows quantitative agreement with spectroscopic measurements. This constitutes compelling evidence that MEG is more efficient in PbSe quantum dots than in bulk PbSe, which exhibits an MEG efficiency of only 0.31 and a corresponding onset of 4.22 $E_g$. In addition to being a measurement of greater than 100% EQE for quantum dots, the above analysis appears to be one of only two measurements of EQE greater than 100% for any solar cell at short circuit. An EQE of 128% at a photon energy of 7.7 eV has been reported in a bulk silicon photodiode exhibiting impact ionization, corresponding to a relative photon energy of 6.9 $E_g$.

Figure 10:
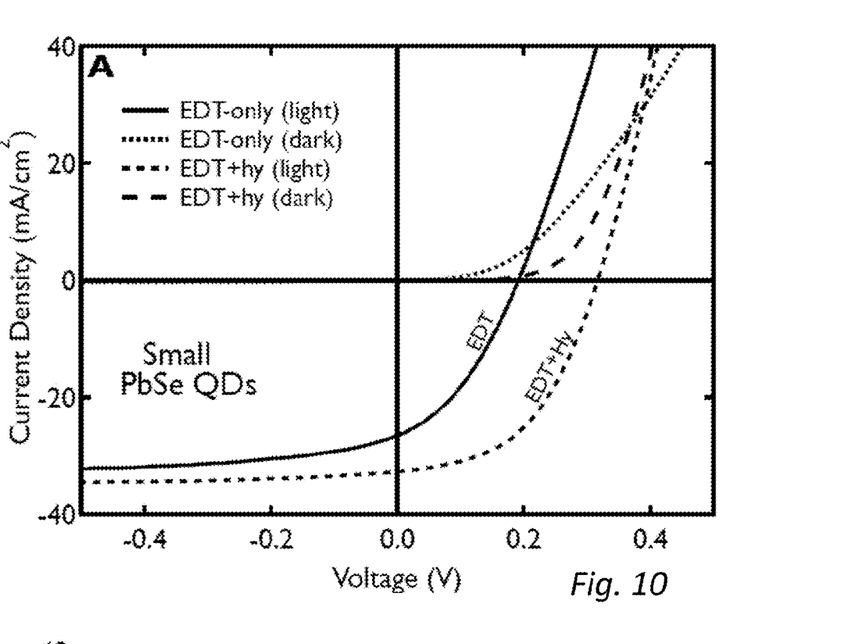
FIG. 10 is a graph showing a comparison of current-voltage characteristics under 100 mW cm$^{-2}$ illumination for small 0.98 eV QD solar cells prepared with and without the enhanced secondary treatment disclosed herein.
Figure 11:
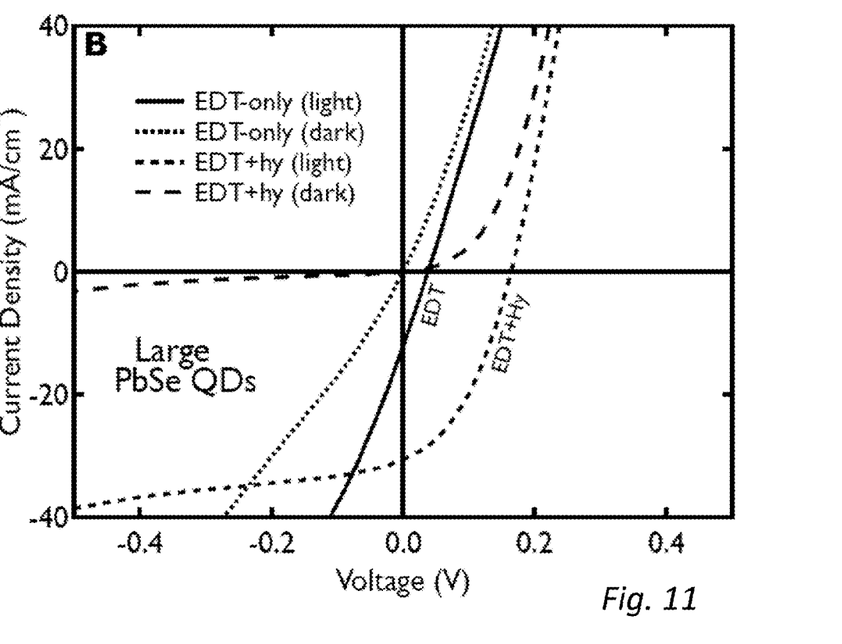
FIG. 11 is a graph showing a comparison of current-voltage characteristics under 100 mW cm$^{-2}$ illumination for larger 0.72 eV QD solar cells prepared with and without the enhanced secondary treatment disclosed herein.

FIGS. 10-13 show the current-voltage characterization of the QD solar cells fabricated above using the enhanced secondary treatment in comparison with devices fabricated without secondary treatment. The performance characteristics illustrated in FIGS. 10-13 were collected under 100 mW cm$^{-2}$ illumination for the smaller 0.98 eV QD devices (FIG. 10) and larger 0.72 eV QD devices (FIG. 11).

For both QD sizes tested, the secondary treatment with hydrazine yields a dramatic improvement over non-enhanced EDT-only treated films in all measured performance parameters. For example, as shown in FIG. 10, the crossover between light and dark currents in forward bias was eliminated by the hydrazine secondary treatment, indicating an ohmic anode contact.

Figure 12:
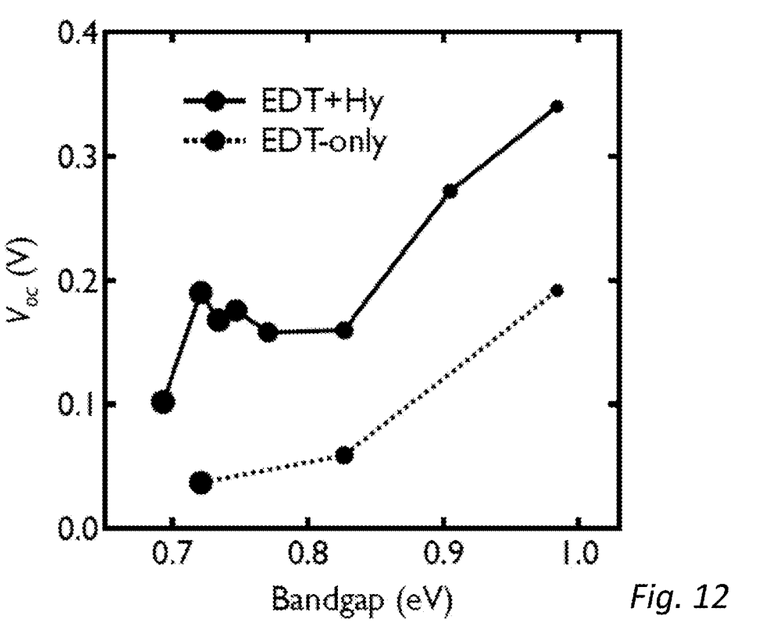
FIG. 12 is a graph showing a comparison of peak $V_{oc}$ for solar cells prepared with and without secondary treatment as disclosed herein for a range of QD sizes plotted against the corresponding bandgaps.
Figure 13:
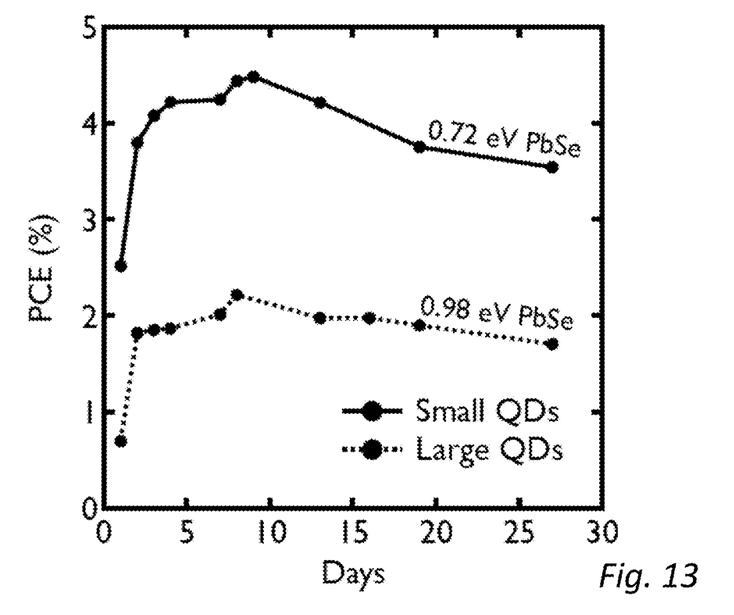
FIG. 13 is a graph showing the effect of aging on mismatch-corrected power conversion efficiency (PCE) in a N2 atmosphere over 25 days for enhanced devices of FIGS. 10 and 11.

FIG. 12 illustrates a comparison of the dependence of the open circuit voltage ($V_{oc}$) on QD bandgap with and without the secondary hydrazine treatment. FIG. 13 illustrates the positive aging effect observed on solar cell performance under air-free nitrogen storage conditions. In particular, FIG. 13 shows the mismatch-corrected power conversion efficiency (PCE) as a function of the device age, with a best PCE of 4.5% after eight days. The above described secondary treatment techniques are effective with both PbSe and PbS QDs. Other secondary treatment chemicals such as formic acid have also been determined to be effective. As the foregoing data shows, the useful effects of the secondary treatment allow multiple carriers produced by MEG to be efficiently collected in a QD solar cell that is both simple to construct and stable under a nitrogen atmosphere.

Several embodiments have been particularly shown and described. It should be understood by those skilled in the art that changes in the form and details may be made to the various embodiments disclosed herein without departing from the spirit and scope of the disclosure and that the various embodiments disclosed herein are not intended to act as limitations on the scope of the claims. Thus, while a number of exemplary aspects and embodiments have been discussed above, those of skill in the art will recognize certain modifications, permutations, additions and sub combinations thereof. It is therefore intended that the following appended claims and claims hereafter introduced are interpreted to include all such modifications, permutations, additions and sub-combinations as are within their true spirit and scope.

What is claimed is:

1. A method of forming an optoelectronic device comprising:
   providing a deposition surface;
   contacting the deposition surface with a ligand exchange chemical and contacting the deposition surface with a quantum dot (QD) colloid over one or more cycles to form an initial QD film on the deposition surface; and
   contacting the initial QD film with a secondary treatment chemical, wherein the secondary treatment chemical is at least one of hydrazine, formic acid, mercaptopropionic acid, an organic acid, ethanol and ethylenediamine.

2. The method of forming an optoelectronic device of claim 1 wherein the step of contacting the initial QD film with the secondary treatment chemical comprises contacting the initial QD film with the secondary treatment chemical and contacting the deposition surface with the quantum dot (QD) colloid over one or more cycles to deposit additional QD colloids on the initial QD film.

3. The method of forming an optoelectronic device of claim 2 wherein the initial QD film is formed to a thickness of about 40 nm to 400 nm.

4. The method of forming an optoelectronic device of claim 2 wherein the initial QD film is thickened by about 1 nm to 50 nm by the deposition of additional QD colloids in the secondary treatment chemical.

5. The method of forming an optoelectronic device of claim 1 wherein the step of contacting the initial QD film with the secondary treatment chemical comprises contacting the initial QD film with the secondary treatment chemical over one or more cycles without depositing additional QD colloids on the initial QD film.

6. A method of forming a solar cell comprising:
   providing a substrate;
   forming a first electrode in contact with the substrate;
   contacting the first electrode with a ligand exchange chemical and contacting the first electrode with a quantum dot (QD) colloid over one or more cycles to form an initial QD film in contact with the first electrode;
   contacting the initial QD film with a secondary treatment chemical, wherein the secondary treatment chemical is at least one of hydrazine, formic acid, mercaptopropionic acid, an organic acid, ethanol and ethylenediamine; and
   forming a second electrode in contact with the initial QD film, not in contact with the first electrode.

7. The method of forming a solar cell of claim 6 wherein the step of contacting the initial QD film with the secondary treatment chemical comprises contacting the initial QD film with the secondary treatment chemical and contacting the deposition surface with a quantum dot (QD) colloid over one or more cycles to deposit additional QD colloids on the initial QD film.

8. The method of forming a solar cell of claim 7 wherein the initial QD film is formed to a thickness of about 40 nm to 400 nm.

9. The method of forming a solar cell of claim 7 wherein the initial QD film is thickened by about 1 nm to 50 nm by the deposition of additional QD colloids in the secondary treatment chemical.

10. The method of forming a solar cell of claim 6 wherein the step of contacting the initial QD film with the secondary treatment chemical comprises contacting the initial QD film with the secondary treatment chemical over one or more cycles without depositing additional QD colloids on the initial QD film.

11. The method of forming a solar cell of claim 6 further comprising forming a doped window layer in contact with the first electrode and the initial QD film.

* * * * *